(12) United States Patent
Sharma et al.

(10) Patent No.: US 9,275,334 B2
(45) Date of Patent: Mar. 1, 2016

(54) INCREASING SIGNAL TO NOISE RATIO FOR CREATION OF GENERALIZED AND ROBUST PREDICTION MODELS

(71) Applicant: Applied Materials, Inc., Santa Clara, CA (US)

(72) Inventors: Deepak Sharma, Delhi (IN); Helen R. Armer, Los Altos, CA (US); James Moyne, Canton, MI (US)

(73) Assignee: Applied Materials, Inc., Santa Clara, CA (US)

( * ) Notice: Subject to any disclaimer, the term of this patent is extended or adjusted under 35 U.S.C. 154(b) by 308 days.

(21) Appl. No.: 13/856,288

(22) Filed: Apr. 3, 2013

(65) Prior Publication Data
US 2013/0268469 A1 Oct. 10, 2013

Related U.S. Application Data

(60) Provisional application No. 61/621,330, filed on Apr. 6, 2012.

(51) Int. Cl.
*G06N 5/02* (2006.01)
*G06F 15/18* (2006.01)
*G06N 99/00* (2010.01)
*G05B 19/00* (2006.01)
*G06F 17/50* (2006.01)

(52) U.S. Cl.
CPC ........ *G06N 5/02* (2013.01); *G05B 19/00* (2013.01); *G06F 17/5036* (2013.01); *G06N 5/022* (2013.01); *G06N 99/005* (2013.01)

(58) Field of Classification Search
None
See application file for complete search history.

(56) References Cited

U.S. PATENT DOCUMENTS

| | | | | |
|---|---|---|---|---|
| 6,470,229 | B1 * | 10/2002 | Wang et al. | 700/121 |
| 7,117,188 | B2 * | 10/2006 | Guyon et al. | 706/19 |
| 7,593,934 | B2 * | 9/2009 | Li et al. | 707/999.002 |
| 2001/0050592 | A1 * | 12/2001 | Wright et al. | 330/2 |
| 2001/0051934 | A1 | 12/2001 | Oyanagi et al. | |
| 2005/0130230 | A1 * | 6/2005 | Davalos et al. | 702/19 |
| 2005/0234688 | A1 * | 10/2005 | Pinto et al. | 703/6 |
| 2005/0234960 | A1 | 10/2005 | Chickering et al. | |
| 2006/0246495 | A1 * | 11/2006 | Garrett et al. | 435/6 |
| 2008/0097938 | A1 * | 4/2008 | Guyon et al. | 706/12 |
| 2008/0300797 | A1 * | 12/2008 | Tabibiazar et al. | 702/19 |
| 2009/0119392 | A1 | 5/2009 | Bonjour et al. | |

(Continued)

FOREIGN PATENT DOCUMENTS

WO 2004053659 6/2004

OTHER PUBLICATIONS

Dwyer, K. et al. "Decision tree instability and active learning". Machine Learning : ECML 2007. Lecture Notes in Computer Science, vol. 4701, 2007. (pp. 128-139). DOI:10.1007/978-3-540-74958-5_15.*

(Continued)

*Primary Examiner* — Jeffrey A Gaffin
*Assistant Examiner* — Benjamin Buss
(74) *Attorney, Agent, or Firm* — Lowenstein Sandler LLP

(57) ABSTRACT

A computer system iteratively executes a decision tree-based prediction model using a set of input variables. The iterations create corresponding rankings of the input variables. The computer system generates overall variables contribution data using the rankings of the input variables and identifies key input variables based on the overall variables contribution data.

20 Claims, 8 Drawing Sheets

(56) References Cited

U.S. PATENT DOCUMENTS

| | | | |
|---|---|---|---|
| 2010/0114654 A1* | 5/2010 | Lukose et al. | 705/10 |
| 2010/0332430 A1* | 12/2010 | Caraviello et al. | 706/13 |
| 2011/0036360 A1* | 2/2011 | Lang et al. | 128/898 |
| 2011/0119212 A1* | 5/2011 | De Bruin et al. | 706/12 |
| 2011/0166684 A1 | 7/2011 | Moyne et al. | |
| 2011/0251099 A1* | 10/2011 | Visvanathan et al. | 702/19 |
| 2013/0148525 A1* | 6/2013 | Cuadra Sanchez et al. | 370/252 |
| 2013/0275350 A1* | 10/2013 | Schaffer et al. | 706/12 |
| 2014/0220580 A1* | 8/2014 | Brown et al. | 435/6.12 |
| 2014/0257924 A1* | 9/2014 | Xie et al. | 705/7.31 |
| 2015/0058264 A1* | 2/2015 | Hughes et al. | 706/12 |

OTHER PUBLICATIONS

International Search Report for PCT/US2013/035449 mailed Jul. 30, 2013.

* cited by examiner

INCREASING SIGNAL TO NOISE RATIO FOR CREATION OF GENERALIZED AND ROBUST PREDICTION MODELS

RELATED APPLICATIONS

This patent application claims the benefit under 35 U.S.C. §119(e) of U.S. Provisional Application No. 61/621,330 filed Apr. 6, 2012, which is herein incorporated by reference.

TECHNICAL FIELD

Embodiments of the present disclosure relate to prediction models and, more particularly, to a technique of increasing signal to noise ratio for creation of generalized and robust prediction models.

BACKGROUND

As process windows shrink, semiconductor manufacturers may find it more and more difficult to maintain good yield and avoid excursions (deviations). The yield and device performance may also be more sensitive to process variations. For example, chamber matching based on wafer results and preventing chamber excursions are keys to managing tool variability and its effects on yield and device performance. Advanced statistical and machine learning methods combined with a deep knowledge of tool design can help build generalized models of variability in tools helping to match chambers and to predict excursions. These generalized prediction models can identify variables effecting yield (or causing defect) and can detect chamber excursions.

Typically, advanced statistical methods are used for building high fidelity (high quality) prediction models of performance indicators, for example, for virtual metrology (VM), yield, defects, and predictive maintenance (PdM). Developing high fidelity prediction models is challenging because of highly noisy and correlated input or process data, low signal to noise, and a high variability environment. The correlated data makes it difficult to accurately identify the cause of failure in data. Low signal to noise implies that information may be missing. A high variability process implies that prediction models are not generalized and quickly change.

Developing robust prediction models becomes more challenging due to the large number of input variables, high levels of multicollinearity, and noise. Reducing this input variable list to a smaller list which modeling techniques can handle is usually done using heuristics and past knowledge, which can be very time consuming and prone to errors and can result in less accurate predictive models.

BRIEF DESCRIPTION OF THE DRAWINGS

Various embodiments of the present disclosure will be understood more fully from the detailed description given below and from the accompanying drawings of various embodiments of the disclosure.

DETAILED DESCRIPTION

Implementations of the invention are directed to a method and system for increasing signal to noise ratio for creation of generalized and robust prediction models. Implementations identify key input variables by iteratively executing a prediction model using different weights assigned to the input variables for each iteration. A computing system identifies input variables and creates a decision tree-based prediction model using the input variables. The computing system iteratively executes the decision tree-based prediction model and assigns different weights to the input variables with each iteration. The computing system generates a variables contribution result indicating a contribution of each input variable for each iteration based on the corresponding assigned weights. The computing system generates overall variables contribution result data using the variables contribution results for the iterations and identifies key input variables from the overall variables contribution result data. For example, there may be three hundred (300) input variables and the computing system identifies that fifty (50) of the input variables are key input variables to constitute a strong "signal" and that the other two hundred fifty (250) input variables are not key variables, but rather "noise."

Implementations reduce the time and effort required to increase signal to noise ratio of process data and help create robust and generalized prediction models. Implementations provide a method for reducing the error and time associated with creating a smaller pertinent variable list from a large number of process variables. In one implementation, the data mining ability of a Rules Ensemble (RE) algorithm is used to filter out variables with low or no effect on the performance indicator. Once a smaller variable list (key input variables) is identified, a variety of modeling techniques (e.g., Support Vector Machines (SVM), Linear Regression (LR)) can use the key input variables. Implementations provide advantages of saving time, saving computing power and improving accuracy of manufacturing prediction exercises.

Figure 1:
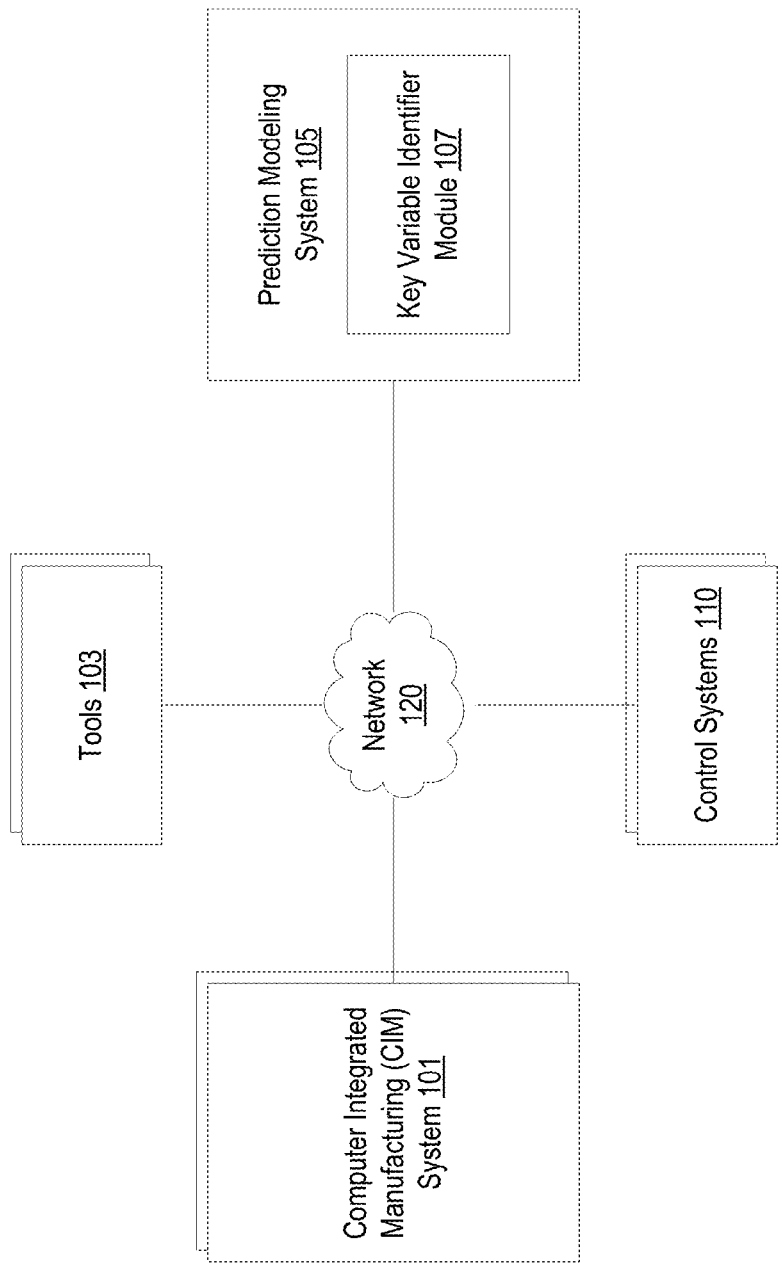
FIG. 1 is a block diagram illustrating a production environment 100, according to some embodiments.

FIG. 1 is a block diagram illustrating a production environment 100, according to some embodiments. A production environment 100 can include for example, and is not limited to, a manufacturing plant and a fulfillment center. For brevity and simplicity, a manufacturing plant that includes a prediction modeling system 105, one or more tools 103, and one or more CIM (computed integrated manufacturing) systems 101 is used as an example of a production environment 100 throughout this document. The CIM system 101, tools 103, and prediction modeling system 105 can communicate, for example, via a network. 120. The network 120 can be a local area network (LAN), a wireless network, a mobile communications network, a wide area network (WAN), such as the Internet, or similar communication system.

Examples of the tools 103 include tools for the manufacture of electronic devices or other products. Examples of tools 103 can include, and are not limited to, incoming wafer quality tools, texturing tools, diffusion tools, etchers, nitride (passivation) tools, cleaning tools, back metal tools, front metal tools, firing tools, isolation tools, testing tools, measurements tools, chemical vapor deposition furnaces, etc.

Examples of CIM systems 101 can include, and are not limited to, a manufacturing execution system (MES), enterprise resource planning (ERP), production planning and control (PPC), computer-aided systems (e.g., design, engineering, manufacturing, processing planning, quality assurance), computer numerical controlled machine tools, direct numerical control machine tools, control systems, etc.

The prediction modeling system 105 can create prediction models to predict, for example, yield, predictive maintenance, virtual metrology (metrology prediction), predictive scheduling, and defects. Developing robust prediction models can be a challenge due to the large number of input variables. The prediction modeling system 105 can include a key variable identifier module 107 to identify key input variables by iteratively executing a prediction model using different weights assigned to the input variables for each iteration. Multiple iterations introduce a level of randomness that can help make the prediction model more generalized.

The key variable identifier module 107 can use data from the one or more tools 103 and/or the CIM systems 101 and a decision tree-based predictive learning technique (e.g., Rules Ensemble) to build a prediction model. The key variable identifier module 107 can run multiple iterations of the decision tree-based prediction model and assign different weights to the input variables in the decision-tree based prediction model to determine which input variables are key. The key input variables can be used to train a manufacturing-related prediction model, such as, and not limited to, a yield prediction model, a predictive maintenance prediction model, etc. The manufacturing-related prediction model can be a SVM (Support Vector Machine_ model or a LR (Logistic Regression) model. Embodiments of using a Rules Ensemble technique to build and execute a prediction model are described in greater detail below in conjunction with FIGS. 2-3. Embodiments can increase signal to noise ratio of process data to create robust and generalized prediction models. Embodiments can increase signal to noise ratio in a control system. The production environment 100 can include a fault detection and classification system. Embodiments can reduce the volume of irrelevant statistics in the fault detection and classification system.

The CIM systems 101, tools 103, prediction modeling system 105, and key variable identifier module 107 can be individually or in combination hosted together by any type of computing device including server computers, gateway computers, desktop computers, laptop computers, tablet computer, notebook computer, PDA (personal digital assistant), mobile communications devices, cell phones, smart phones, hand-held computers, or similar computing device.

Figure 2:
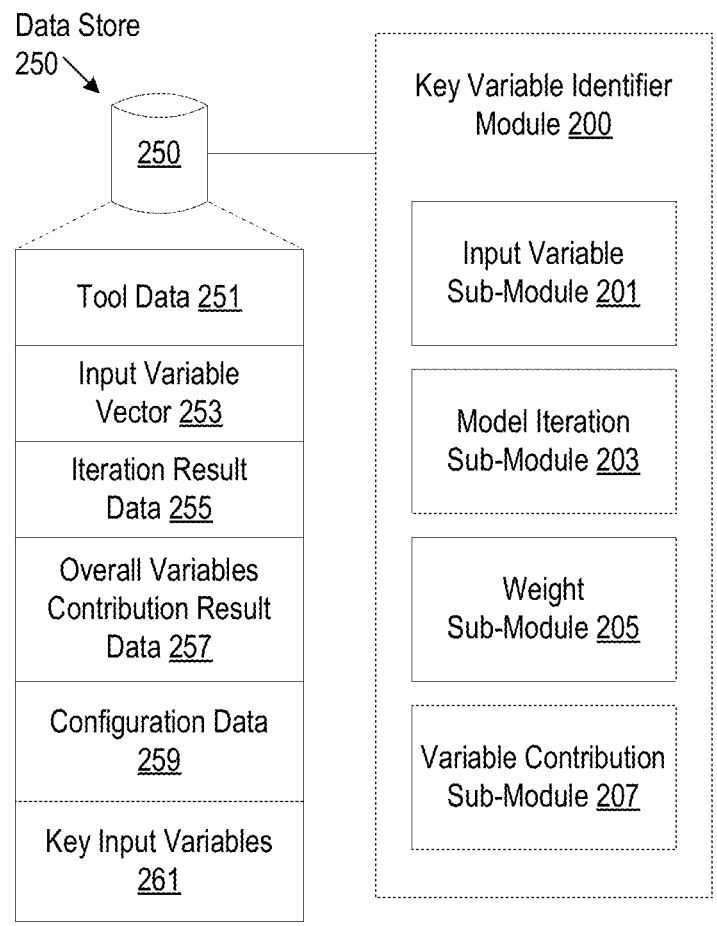
FIG. 2 is a block diagram of one embodiment of a key variable identifier module.

FIG. 2 is a block diagram of one embodiment of a key variable identifier module 200. The key variable identifier module 200 may be the same as the key variable identifier module 107 in FIG. 1. The key variable identifier module 200 includes an input variable sub-module 201, a model iteration sub-module 203, a weight sub-module 205, and a variable contribution sub-module 207. Note that in alternative embodiments, the functionality of the input variable sub-module 201, the model iteration sub-module 203, the weight sub-module 205, and the variable contribution sub-module 207 may be combined or further divided.

The input variable sub-module 201 can identify input variables. The input variables can be process fault detection and classification (FDC) variables. For example, the input variables may be various sensor statistics calculated for various steps that are run on wafers. The input variable sub-module 201 can be coupled to one or more data stores 250 that store tool data 251 collected from one or more tools and/or CIM systems. The tools can be wafer processing tools and the data can be indicative of whether or not each wafer is classified as a good (of sufficient quality) wafer or a bad (of insufficient quality) wafer. For example, the tool data 251 is data collected from an etch tool for 1500 wafers. One data point may represent one wafer. Each wafer may be classified as good or bad based on the data from the etch tool. Each wafer may have 1040 process variables as inputs. The process variables may be step level statistics for process sensors. The input variable sub-module 201 can create an input variable vector 253 to represent the identified input variables based on the tool data 251. The input variable sub-module 201 can store the input variable vector 253 in the data store 250.

The model iteration sub-module 203 can use a decision tree-based predictive learning technique and the input variables to build a prediction model. Examples of a prediction model can include, and are not limited to, a yield prediction model, a preventative maintenance prediction model, a metrology prediction model, a defect prediction model, a virtual metrology prediction model, a preventative scheduling prediction model, etc. Examples of a decision tree-based prediction learning technique can include, and are not limited to, Rules Ensemble, Random Forest, etc. Rules Ensembles is a decision tree based predictive learning technique to combine a large number of weak learners (e.g., decision trees) to construct a strong learner. In rules ensembles, the base learners are simple rules constructed using decision trees built from data. The decision tree defines a set of rules. A rule can be a conjunction of a small number of simple statements concerning the values of individual input variables. The set rules can be of simple form, can be easily interpreted, which can produce good (of sufficient quality) prediction accuracy. A decision tree can include a root node, one or more interior nodes, and one or more terminal nodes. The interior nodes can correspond to input variables. The tree can include edges to connect the nodes. Each edge of the tree connecting a "parent" node to one of its "child" nodes represents a factor that contributes to a rule in the decision tree. In one implementation, the rule that corresponds to a node in the tree is defined by the product of the factors that are associated with all of the edges on the path from the root node to the node. The rules can be used to create the predictive model (e.g., yield prediction model, a preventative maintenance prediction model, a metrology prediction model).

The model iteration sub-module 203 can execute a number of iterations of the prediction model, which executes the rules of the prediction model using the input variables. The number of iterations can be user-defined and stored as part of configuration data 259 in the data store 250. For each iteration, the model iteration sub-module 205 can create a ranking of the input variables based on the number of data points which the set of rules affects. The ranking can represent the variable contribution of each input variable relative to the other input variables. Variable contribution is the relative importance or relevance of the respective input variables to the prediction model. The most relevant input variables can be those that preferentially define the most influential predictors appearing in the prediction model. Input variables that frequently appear in important predictions can be more relevant than those that tend to appear only in less influential predictors. The model iteration sub-module 205 can store the set of rules and the rankings for each iteration as part of iteration result data 255 in the data store 250.

The weight sub-module 205 can assign a weight to each input variable in the prediction model and can change the weights assigned to the input variables for each iteration of executing the prediction model. The values for the weights can be based on the order of the input variables in the input variable vector 253. In one embodiment, the weight sub-module 205 changes the weight values assigned to the input variables by changing the order of the input variables in the input variable vector 253. In one embodiment, the weight sub-module 205 randomly alters the order of the input variables in the input variable vector 253. The weights can be pre-defined and/or user (e.g., system engineer, industrial engineer, process engineer, etc.). The weight values can be stored in the data store 250.

The variable contribution sub-module 207 can combine results for all of the iterations in the iteration result data 255 to generate overall variables contribution result data 257 that indicates which input variables are key input variables. The overall variables contribution result data 257 can be a list. One embodiment of a list of the overall variables contribution result data is described in greater detail below in conjunction with FIG. 7. The overall variables contribution result data 257 can be a graphical representation. One embodiment of a graphical representation of the overall variables contribution result data is described in greater detail below in conjunction with FIG. 6. The variable contribution sub-module 207 can store the overall variables contribution result data 257 in the data store 250.

The variable contribution sub-module 207 can determine which input variables are key input variables using a cutoff threshold and the overall variables contribution result data 257. One embodiment of using a cutoff threshold to identify the key input variables is described in greater detail below in conjunction with FIG. 3. The threshold can be pre-defined and/or user (e.g., system engineer, industrial engineer, process engineer, etc.). The threshold can be stored in the data store 250. The variable contribution sub-module 207 can store the key input variables 261 in the data store. The key input variables 261 can be a vector.

A data store 250 can be a persistent storage unit. A persistent storage unit can be a local storage unit or a remote storage unit. Persistent storage units can be a magnetic storage unit, optical storage unit, solid state storage unit, electronic storage units (main memory), or similar storage unit. Persistent storage units can be a monolithic device or a distributed set of devices. A 'set', as used herein, refers to any positive whole number of items.

Figure 3:
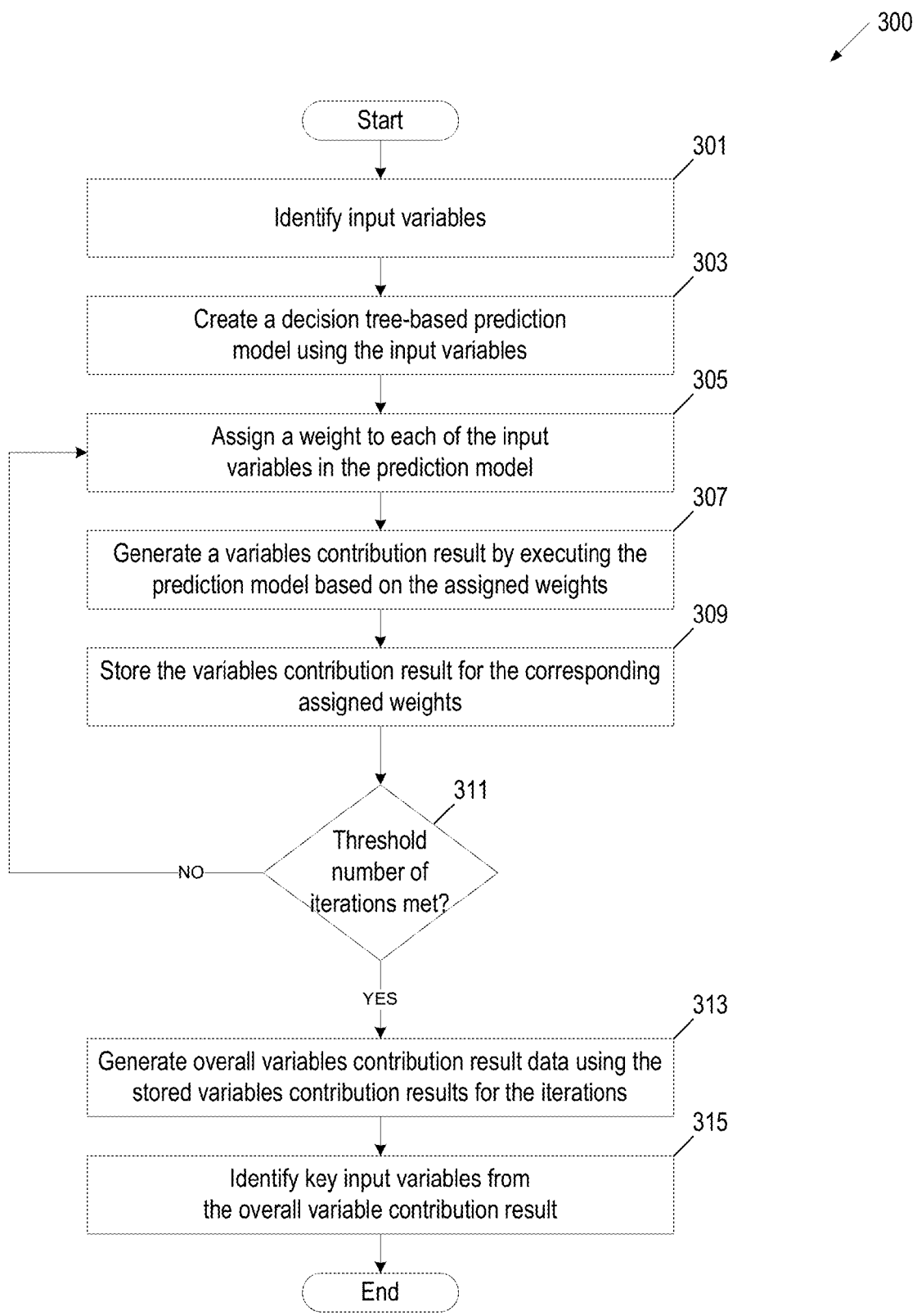
FIG. 3 is a flow diagram of an embodiment of a method for identifying key input variables by executing a prediction model for multiple iterations using different weights assigned to the input variables for each iteration.

FIG. 3 is a flow diagram of an embodiment of a method 300 for identifying key input variables by executing a prediction model for multiple iterations using different weights assigned to the input variables for each iteration. Method 300 can be performed by processing logic that can comprise hardware (e.g., circuitry, dedicated logic, programmable logic, microcode, etc.), software (e.g., instructions run on a processing device), or a combination thereof. In one embodiment, method 300 is performed by a key variable identifier module 107 of FIG. 1.

At block 301, processing logic identifies input variables. The input variables can be process fault detection and classification (FDC) variables. For example, the input variables may be based on data from one or more semiconductor manufacturing tools that include wafer level data with each wafer classified as good or bad quality. For example, the input variables may include 1040 input variables consisting of five sensor statistics calculated for four steps of each wafer run for 52 sensors. The five sensor statistics can include, for example, average, standard deviation, area, maximum, and minimum of the sensor trace for each of the four steps. In one embodiment, the processing logic creates a vector of the input variables. For example, the input variable vector includes the 1040 input variables.

At block 303, processing logic creates a decision tree-based prediction model using the input variables. Examples of a prediction model can include, and are not limited to, a yield prediction model, a preventative maintenance prediction model, a metrology prediction model, a defect prediction model, etc. Processing logic can build a prediction model using decision trees. In one embodiment, processing logic uses a Rules Ensemble algorithm and decision trees to create the prediction model. In another embodiment, processing logic uses a Random Forest algorithm and decision trees to create the prediction model.

A decision tree can build a prediction model with low complexity but high variance. The Rules Ensemble algorithm is an improvement over decision trees with the idea taken from boosting of trees. Boosting is a general method for improving the performance of a learning algorithm. A Rules Ensemble-based prediction model can be written as $$F(x)=a_0+\Sigma a_m r_m(x) \qquad \text{Eq. (1)}$$

F(x) is the functional estimate to predict, for example, yield, metrology, defects, etc., and x is a vector of the input variables (e.g., process FDC variables). $r_m(x)$ is a rule of the form $$r_m(x)=\Pi I(x_j \epsilon S_{jm}), \text{ where } I \text{ is a binary function} \qquad \text{Eq. (2)}$$

An example of the rule can include, and is not limited to, $$r_m(x)=I(x_1<10)*I(x_2>1000)*I(x_3==2.2) \qquad \text{Eq. (3)}$$

Where $x_1$, $x_2$, and $x_3$ can be input variables (e.g., process FDC variables). Processing logic can generate rules using decision trees.

At block 305, processing logic assigns a weight to each of the input variables in the prediction model. In one embodiment, the weights are determined based on an order of the input variables in the input variable vector. In one embodiment, the weights are randomly determined. In one embodiment, a maximum weight value is assigned to the first input variable in the input variable vector and the weight values gradually decrease with each subsequent input variable in the vector. In another embodiment, a minimum weight value is assigned to the first input variable in the input variable vector and the weight values can gradually increase with each subsequent input variable in the vector. The weights can be pre-defined and/or user (e.g., process engineer, system engineer, industrial engineer, etc.) defined.

At block 307, processing logic generates a variables contribution result from executing the prediction model based on the assigned weights. The variables contribution result can include a set of rules and a ranking of the input variables based on the set of rules. Processing logic can rank the input variables based on the number of data points which the set of rules affect. The ranking can represent the variable contribution of each input variable relative to the other input variables. At block 309, processing logic stores the variables contribution result in a data store that is coupled to the key variable identifier module.

At block 311, processing logic determines whether a threshold number of iterations is satisfied. Processing logic can track the number of times the prediction model is executed and compare the number of times the prediction model is executed to a threshold number of iterations stored in the data store. The threshold number of iterations can be user-defined. The threshold number of iterations can be heuristically determined. In one embodiment, the threshold is one greater than the number of input variables. If the threshold number of iterations is not satisfied, processing logic returns to block 305 to assign different weights to the input variables in the prediction model. For example, processing logic creates a changed order of the input variables in the input variable vector to assign different weights to the input variables. In one embodiment, processing logic creates a new order of the input variables in the input variable vector. Some of the input variables in the new order may have a weight value that was previously assigned to the input variable. For example, the new order may include changing the order of the first 3 variables and the order of the remaining 7 variables is unchanged. In another example, all of the input variables are assigned a new weight. Processing logic runs another iteration of the prediction modeling using the newly assigned weights and generates and stores a variables contribution result that corresponds to the newly assigned weights.

If the threshold number of iterations is satisfied, processing logic generates overall variables contribution result data using the stored variables contribution results for all of the iterations. For example, the threshold number of iterations is 1000 and processing logic determines that the prediction model has been executed 1000 times, each iteration using at least some different weights assigned to the input variables. In one embodiment, processing logic generates overall variables contribution result data by combining the stored variables contribution results for all of the iterations and determining a weighted average of the variable contribution of each iteration. The overall variables contribution result data can be a graphical representation presented in a user interface. One embodiment of a graphical representation of the overall variables contribution result data is described in greater detail below in conjunction with FIG. 6. The overall variables contribution result data can be a list. One embodiment of a list of the overall variables contribution result data is described in greater detail below in conjunction with FIG. 7.

At block 315, processing logic identifies key input variables from the overall variables contribution result data. Key input variables can represent which of the input variables have the highest impact, for example, on wafer classification. The overall variables contribution result data can include a ranking list of the input variables. Processing logic can identify which of the input variables are key input variables based on a cutoff threshold. In one embodiment, the cutoff threshold is determined based on an Area Under the Curve (AUC) of ROC (Receiver Operating Characteristics) curve statistic for multiple out of the box samples. The statistic represents how well the prediction model is classifying the output. The number of wafers in an out of the box sample can be user-defined. For example, an out of the box sample is 300 wafers. The point below which variable addition does not significantly increase AUC can be the cutoff threshold. For example, processing logic can start from the highest weighted input variable and continue to add input variables until further addition results in very marginal increase in AUC. In another embodiment, the cutoff threshold is determined using root means square.

Figure 4:
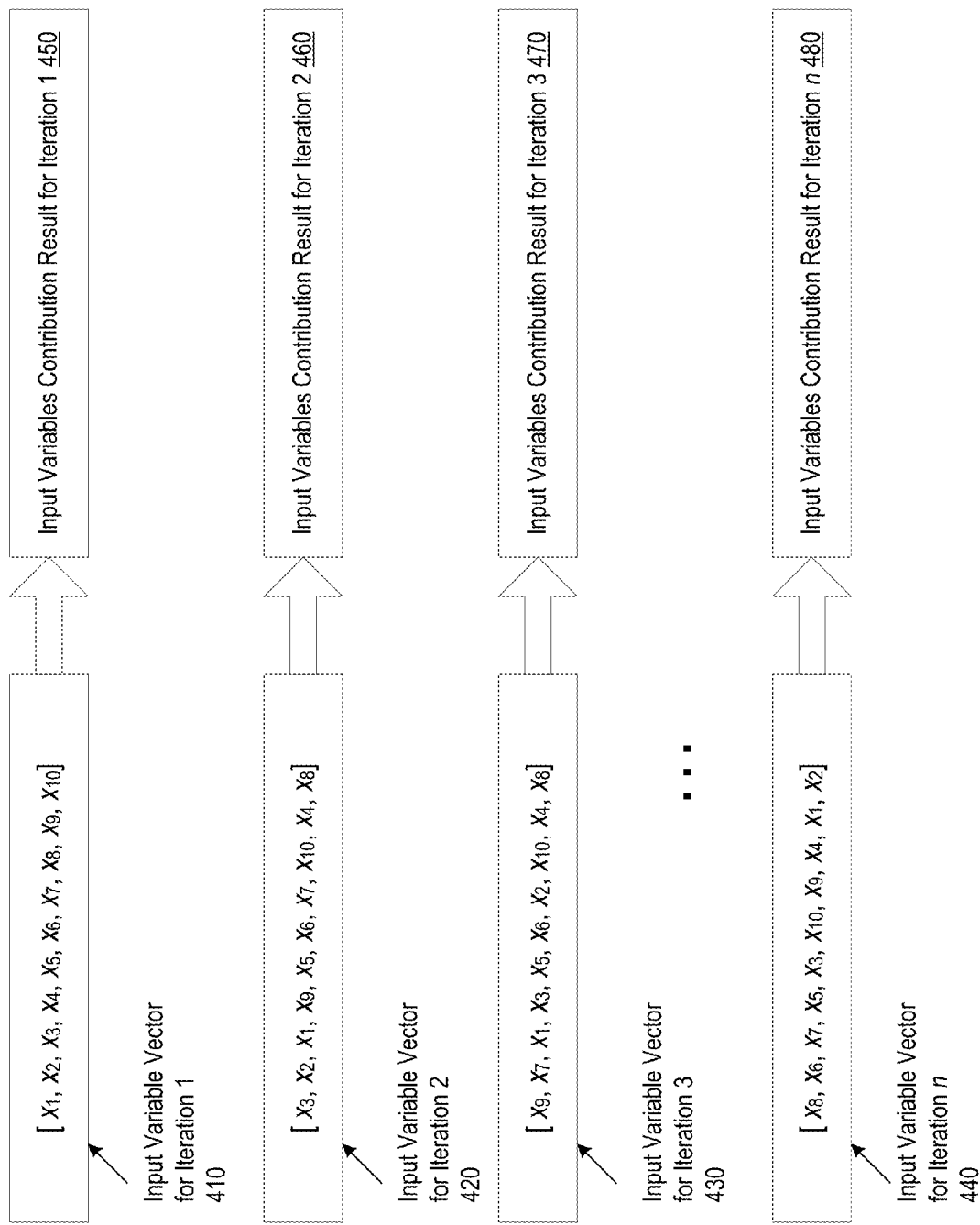
FIG. 4 illustrates exemplary input variable vectors, according to some embodiments.

FIG. 4 illustrates exemplary input variable vectors 410, 420,430,440, according to some embodiments. The input variable vector 410,420,430,440 includes 10 input variables $x_1$ to $x_{10}$. The input variables in the vector 410 for iteration 1 can have an initial order. Weights can be assigned to each input variable based on the order. A prediction model can be executed using the weights assigned based on the initial order to generate an input variables contribution result for iteration 1 (450). One embodiment of an input variables contribution result is described in greater detail below in conjunction with FIG. 5. For a second iteration of executing the prediction model, the initial order of the input variables in the vector 410 can be changed. Input variable vector 420 illustrates an exemplary input variable vector for iteration 2, where the order is changed and some or all of the input variables in vector 420 are assigned different weights based on the changed order. The prediction model can be executed for a second iteration using the weights assigned based on the changed order to generate an input variables contribution result for iteration 2 (460). For a third iteration of executing the prediction model, the previous order of the input variables in the vector 420 can be changed. Input variable vector 430 illustrates an exemplary input variable vector for iteration 3, where the order is changed and some or all of the input variables in vector 430 are assigned different weights based on the changed order. The prediction model can be executed for a third iteration using the weights assigned based on the changed order to generate an input variables contribution result for iteration 3 (470). For an $n^{th}$ iteration of executing the prediction model, the previous order of the input variables can be changed. Input variable vector 440 illustrates an exemplary input variable vector for iteration n, where the order is changed and some or all of the input variables in vector 440 are assigned different weights based on the changed order. The prediction model can be executed for an $n^{th}$ iteration using the weights assigned based on the changed order to generate an input variables contribution result for iteration n (480).

Figure 5:
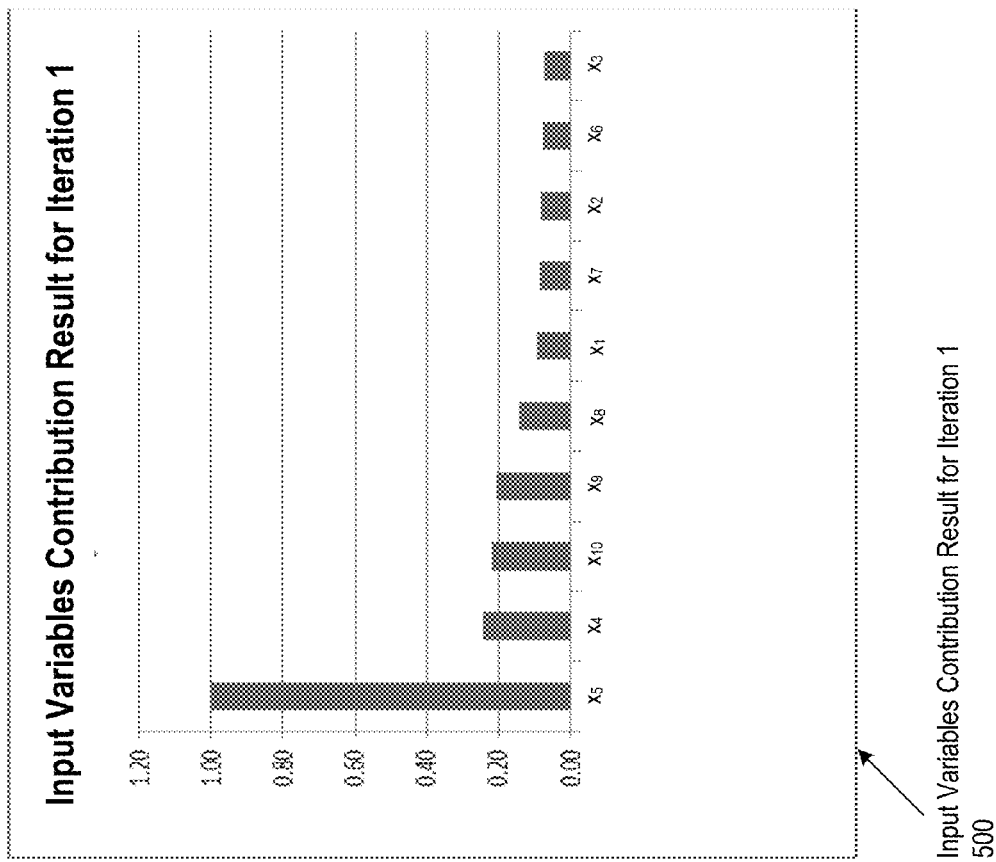
FIG. 5 illustrates an exemplary input variables contribution result for an iteration of executing the prediction model based on the assigned weights, according to some embodiments.

FIG. 5 illustrates an exemplary input variables contribution result 500 for an iteration of executing the prediction model based on the assigned weights, according to some embodiments. The input variables contribution result 500 can be a graphical representation presented in a user interface. The variables contribution result 500 includes a ranking of the input variables ($x_1$ to $x_{10}$) based on a set of rules. The ranking represents the impact of each input variable relative to the other input variables. For example, variable $x_5$ (Chuck_Pos_Step2_Mean) has the highest impact on the prediction model based on the weights assigned to the input variables for this particular iteration.

Figure 6:
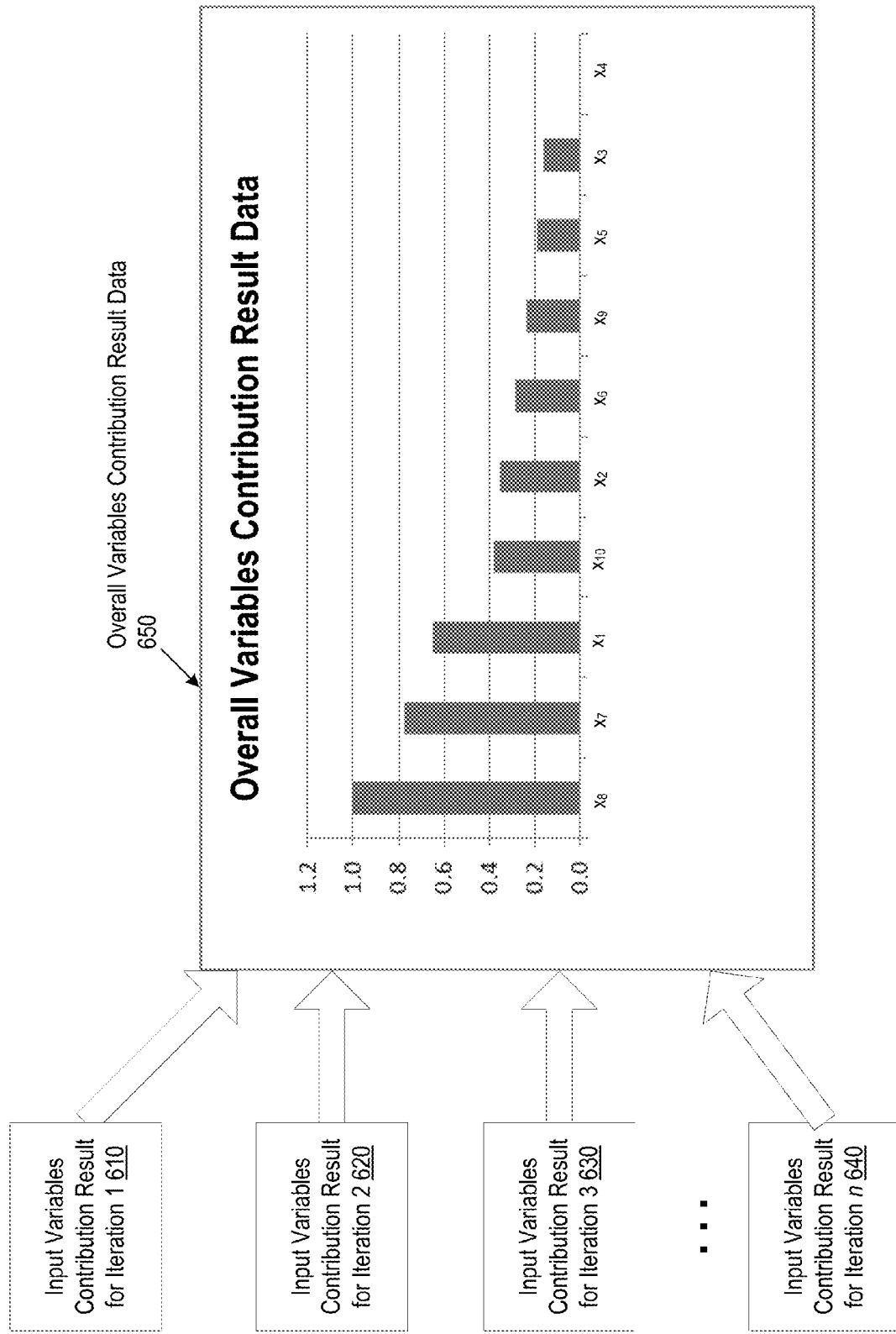
FIG. 6 illustrates an exemplary graphical representation of overall variables contribution result data based on the input variables contribution results for the iterations, according to some embodiments.

FIG. 6 illustrates an exemplary graphical representation of overall variables contribution result data 650 based on the input variables contribution results for the iterations, according to some embodiments. The input variables contribution results for the iterations 610,620,630,640 can be combined and a weighted average of the variable contribution of each iteration can be determined to generate the overall variables contribution result data 650.

Figure 7:
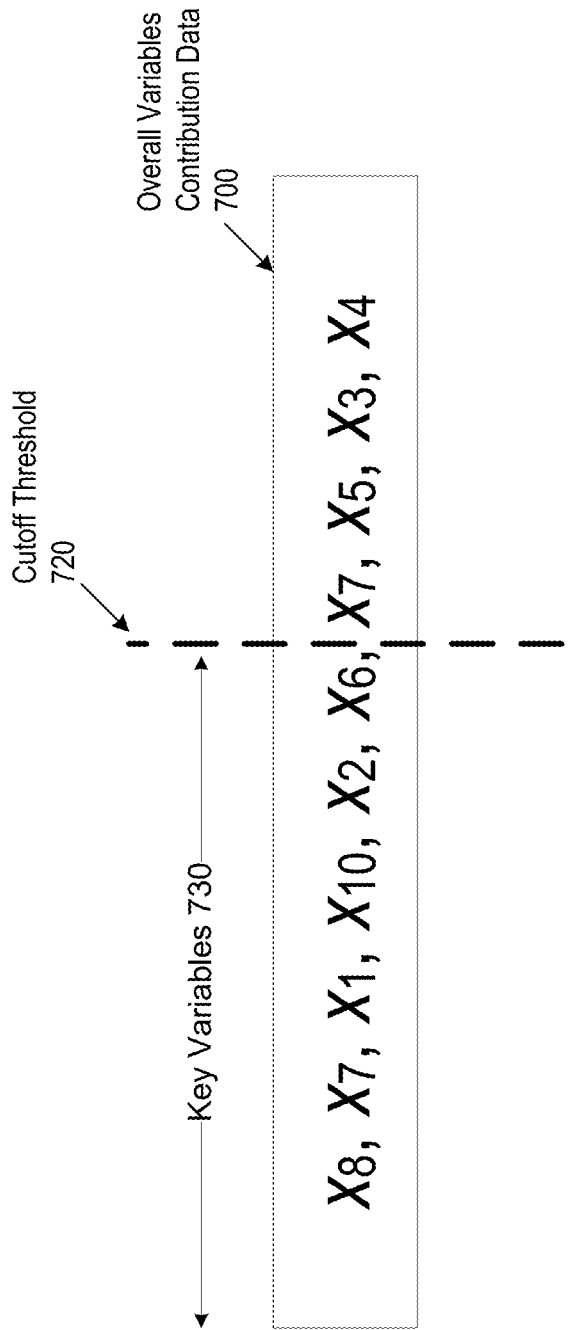
FIG. 7 illustrates an exemplary list of overall variables contribution result data 700 based on the input variables contribution results for the iterations, according to some embodiments.

FIG. 7 illustrates an exemplary list of overall variables contribution result data 700 based on the input variables contribution results for the iterations, according to some embodiments. The list 700 can indicate a rank for each input variable. A cutoff threshold 720 can be used to identify which input variables are key variables 730. For example, variables $x_8$, $x_7$, $x_1$, $x_{10}$, $x_2$, and $x_6$ are identified as key variables. In one embodiment, the cutoff threshold 720 is determined based on an Area Under the Curve (AUC) of ROC curve statistic. In another embodiment, the cutoff threshold 720 is determined using root means square.

Figure 8:
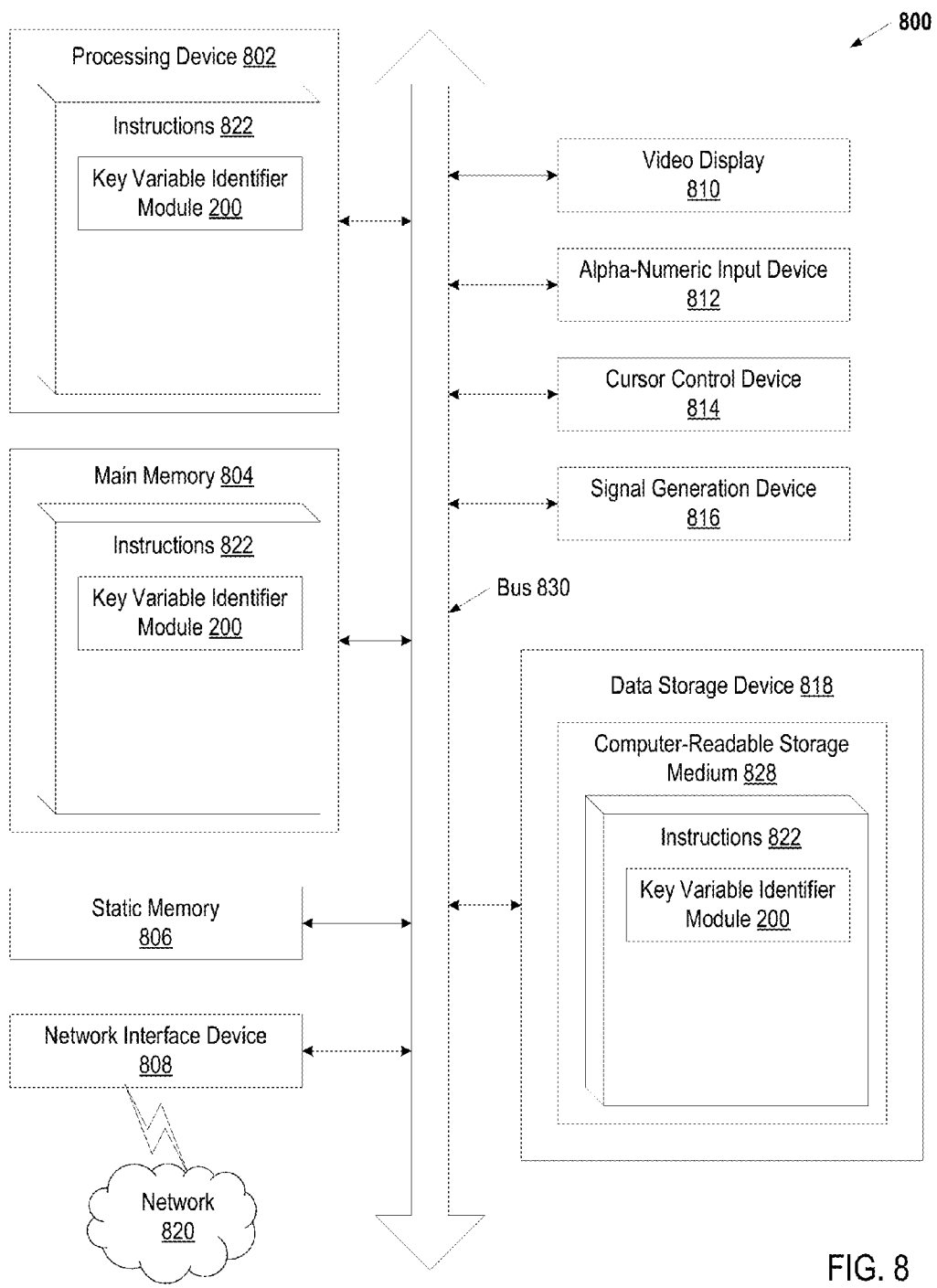
FIG. 8 is a diagram of one embodiment of a computer system that may perform one or more of the operations described herein.

FIG. 8 illustrates a diagram of a machine in the exemplary form of a computer system 800 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 800 includes a processing device (processor) 802, a main memory 804 (e.g., read-only memory (ROM), flash memory, dynamic random access memory (DRAM) such as synchronous DRAM (SDRAM), double data rate (DDR SDRAM), or DRAM (RDRAM), etc.), a static memory 806 (e.g., flash memory, static random access memory (SRAM), etc.), and a data storage device 818, which communicate with each other via a bus 730.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 802 may also be one or more special-purpose processing devices such as an application specific integrated circuit (ASIC), a field programmable gate array (FPGA), a digital signal processor (DSP), network processor, or the like. The processor 802 is configured to execute instructions 822 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable storage medium 828 on which is stored one or more sets of instructions 822 (e.g., software) embodying any one or more of the methodologies or functions described herein. The instructions 822 may also reside, completely or at least partially, within the main memory 804 and/or within the processor 802 during execution thereof by the computer system 800, the main memory 804 and the processor 802 also constituting computer-readable storage media. The instructions 822 may further be transmitted or received over a network 820 via the network interface device 808.

In one embodiment, the instructions 822 include instructions for an in-memory compression/decompression system (e.g., in-memory compression/decompression system 300 of FIG. 3) and/or a software library containing methods that call in-memory compression/decompression system. While the computer-readable storage medium 828 (machine-readable storage medium) is shown in an exemplary embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present invention may be practiced without these specific details. In some instances, well-known structures and devices are shown in block diagram form, rather than in detail, in order to avoid obscuring the present invention.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "identifying," "creating," "executing," "generating," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

For simplicity of explanation, the methods are depicted and described herein as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

Certain embodiments of the present invention also relate to an apparatus for performing the operations herein. This apparatus may be constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
   creating a plurality of sets of rankings of a plurality of input variables by executing a decision tree-based prediction model for a plurality of iterations using the plurality of input variables, the plurality of iterations corresponding to the plurality of sets of rankings, the plurality of input variables being based on data from at least one semiconductor manufacturing tool;
   generating overall variables contribution data using the rankings of the plurality of input variables; and
   identifying a plurality of key input variables from the plurality of input variables based on the overall variables contribution data.

2. The method of claim 1, wherein generating the variables contribution data is based on at least one of a rules ensemble algorithm, a support vector machine algorithm, linear regression algorithm, or partial least squares algorithm.

3. The method of claim 1, wherein creating the plurality of sets of rankings comprises:
   assigning a different weight to at least one of the plurality of input variables for the plurality of iterations.

4. The method of claim 3, wherein the different weight is at least one of assigned using an order of the plurality of input variables in a vector or assigned randomly.

5. The method of claim 1, wherein generating the overall variables contribution data comprises:
   generating a plurality of variables contribution results corresponding to the plurality of iterations, the plurality of variables contribution results indicating a plurality of contributions corresponding to the plurality of input variables for the corresponding iteration.

6. The method of claim 5, wherein generating the overall variables contribution data comprises:
   combining the plurality of variables contribution results for the plurality of iterations; and
   determining a weighted average of the contribution for each of the plurality of input variables for the corresponding iteration.

7. The method of claim 1, wherein identifying the plurality of key input variables is based on a threshold, wherein the threshold is at least one of an area under curve statistic or a receiver operating characteristic curve statistic.

8. The method of claim 1, further comprising:
   training a manufacturing-related prediction model using the plurality of key input variables.

9. A non-transitory computer readable storage medium including instructions that, when executed by a processing device, cause the processing device to perform operations comprising:
   creating a plurality of sets of rankings of a plurality of input variables by executing a decision tree-based prediction model for a plurality of iterations using the plurality of input variables, the plurality of iterations corresponding to the plurality of sets of rankings, the plurality of input variables being based on data from at least one semiconductor manufacturing tool;
   generating overall variables contribution data using the rankings of the plurality of input variables; and
   identifying, by the processing device, a plurality of key input variables from the plurality of input variables based on the overall variables contribution data.

10. The non-transitory computer readable storage medium of claim 9, wherein generating the variables contribution data is based on at least one of a rules ensemble algorithm, a support vector machine algorithm, linear regression algorithm, or partial least squares algorithm.

11. The non-transitory computer readable storage medium of claim 9, wherein creating the plurality of sets of rankings comprises:
    assigning a different weight to at least one of the plurality of input variables for the plurality of iterations, wherein the different weight is at least one of assigned using an order of the plurality of input variables in a vector or assigned randomly.

12. The non-transitory computer readable storage medium of claim 9, wherein generating the overall variables contribution data comprises:
    generating a plurality of variables contribution results corresponding to the plurality of iterations, the plurality of variables contribution results indicating a plurality of contributions corresponding to the plurality of input variables for the corresponding iteration;
    combining the plurality of variables contribution results for the plurality of iterations; and
    determining a weighted average of the contribution for each of the plurality of input variables for the corresponding iteration.

13. The non-transitory computer readable storage medium of claim 9, wherein identifying the plurality of key input variables is based on a threshold, wherein the threshold is at least one of an area under curve statistic or a receiver operating characteristic curve statistic.

14. The non-transitory computer readable storage medium of claim 9, the operations further comprising:
    training a manufacturing-related prediction model using the plurality of key input variables.

15. A system comprising:
    a memory to store a plurality of input variables; and
    a processing device coupled to the memory to
      create a plurality of sets of rankings of a plurality of input variables by executing a decision tree-based prediction model for a plurality of iterations using the plurality of input variables, the plurality of iterations corresponding to the plurality of sets of rankings, the plurality of input variables being based on data from at least one semiconductor manufacturing tool;
generate overall variables contribution data using the rankings of the plurality of input variables; and
identify a plurality of key input variables from the plurality of input variables based on the overall variables contribution data.

16. The system of claim 15, wherein to generate the variables contribution data is based on at least one of a rules ensemble algorithm, a support vector machine algorithm, linear regression algorithm, or partial least squares algorithm.

17. The system of claim 15, wherein the processing device is to create the plurality of sets of rankings by:
assigning a different weight to at least one of the plurality of input variables for the plurality of iterations, wherein the different weight is at least one of assigned using an order of the plurality of input variables in a vector or assigned randomly.

18. The system of claim 15, wherein the processing device is to generate the overall variables contribution data by:
generating a plurality of variables contribution results corresponding to the plurality of iterations, the plurality of variables contribution results indicating a plurality of contributions corresponding to the plurality of input variables for the corresponding iteration;
combining the plurality of variables contribution results for the plurality of iterations; and
determining a weighted average of the contribution for each of the plurality of input variables for the corresponding iteration.

19. The system of claim 15, wherein the processing device is to identify the plurality of key input variables based on a threshold, wherein the threshold is at least one of an area under curve statistic or a receiver operating characteristic curve statistic.

20. The system of claim 15, wherein the processing device is further to:
train a manufacturing-related prediction model using the plurality of key input variables.

* * * * *